US012294308B2

(12) United States Patent
Wen et al.

(10) Patent No.: US 12,294,308 B2
(45) Date of Patent: May 6, 2025

(54) CIRCUIT AND METHOD FOR COMPENSATING OUTPUT OF VOLTAGE SOURCE, AND VOLTAGE SOURCE

(71) Applicant: Telefonaktiebolaget LM Ericsson (publ), Stockholm (SE)

(72) Inventors: Chao Wen, Beijing (CN); Tai Ma, Beijing (CN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 118 days.

(21) Appl. No.: 17/927,163

(22) PCT Filed: May 22, 2020

(86) PCT No.: PCT/CN2020/091894
§ 371 (c)(1),
(2) Date: Nov. 22, 2022

(87) PCT Pub. No.: WO2021/232426
PCT Pub. Date: Nov. 25, 2021

(65) Prior Publication Data
US 2023/0318461 A1  Oct. 5, 2023

(51) Int. Cl.
*H02M 1/15* (2006.01)
*G01R 19/165* (2006.01)
(Continued)

(52) U.S. Cl.
CPC .. *H02M 3/33561* (2013.01); *G01R 19/16538* (2013.01); *H02M 1/143* (2013.01); *H02M 1/15* (2013.01)

(58) Field of Classification Search
CPC ............. H02M 3/335; H02M 3/33507; H02M 3/33523; H02M 3/33553; H02M 3/33561; H02M 1/143; H02M 1/15; G01R 19/16538
See application file for complete search history.

(56) References Cited

U.S. PATENT DOCUMENTS 6,472,945 B1   10/2002  Gumm
6,853,565 B1*  2/2005   Liao ........................ H02M 1/36
                                                    363/56.05

(Continued)

FOREIGN PATENT DOCUMENTS

CN    102385408 A    3/2012
CN    202257346 U    5/2012
(Continued)

OTHER PUBLICATIONS

Erickson Robert W. et al. "Controller Design" 2007, pp. 331-369.
(Continued)

*Primary Examiner* — Gary L Laxton
(74) *Attorney, Agent, or Firm* — Rothwell, Figg, Ernst & Manbeck, P.C.

(57) ABSTRACT

The present disclosure relates to a circuit and a method for compensating output of voltage source, and the voltage source. The circuit for compensating an output of a voltage source, comprises: a sensing unit, a first adjustment unit, an amplifier unit, and a second adjustment unit. The first adjustment unit is coupled in parallel with the sensing unit, and configured to generate at least one pole point and/or at least one zero point in a transfer function of the circuit; the second adjustment unit is configured to generate at least one zero point in the transfer function of the circuit. Therefore, the first adjustment unit, and the second adjustment unit are arranged for generating adjustable zero points and pole points in the transfer function of the voltage source, so as to obtain a higher loop bandwidth.

17 Claims, 11 Drawing Sheets

(51) Int. Cl.
 *H02M 1/14* (2006.01)
 *H02M 3/335* (2006.01)

(56) References Cited

U.S. PATENT DOCUMENTS

| | | |
|---|---|---|
| 2006/0012356 A1 | 1/2006 | Kase et al. |
| 2007/0057660 A1 | 3/2007 | Lin |
| 2015/0115919 A1* | 4/2015 | Yang ................ H02M 3/33507 323/282 |
| 2022/0077786 A1* | 3/2022 | Yang ................ H02M 3/33523 |

FOREIGN PATENT DOCUMENTS

| | | |
|---|---|---|
| CN | 204833032 U | 12/2015 |
| CN | 109327146 A | 2/2019 |

OTHER PUBLICATIONS

International Search Report and the Written Opinion of the International Searching Authority, issued in corresponding International Application No. PCT/CN2020/091894, dated Feb. 22, 2021, 7 pages.

* cited by examiner

CIRCUIT AND METHOD FOR
COMPENSATING OUTPUT OF VOLTAGE
SOURCE, AND VOLTAGE SOURCE

CROSS REFERENCE TO RELATED APPLICATION(S)

This application is a 35 U.S.C. § 371 National Phase Entry Application of PCT/CN2020/091894, filed May 22, 2020, designating the United States, the disclosure of which is incorporated herein by reference in its entirety.

TECHNICAL FIELD

The present disclosure relates generally to the electric technology, and in particular, to a method for a circuit and a method for compensating an output of a voltage source, and the voltage source.

BACKGROUND

This section introduces aspects that may facilitate better understanding of the present disclosure. Accordingly, the statements of this section are to be read in this light and are not to be understood as admissions about what is in the prior art or what is not in the prior art.

A voltage source is a widely used electrical component to output predefined voltage to other components (i.e. loads) in a circuit system. The stability of the output voltage of the voltage source is desired. However, many reasons affecting the stability are unavoidable. For example, loads may be added to or removed from the circuit system, or the operation states of the existing loads may vary in different time points. Particularly, when the loads suddenly become heavier, (e.g. when more loads suddenly exist, and/or a bigger current is suddenly consumed by the existing loads), an obvious voltage drop at the output of the voltage source may happen, due to a relatively fixed output power level of the voltage source. An obvious voltage rise at the output of the voltage source may also happen due to reduced loads, etc.

Conventionally, a feedback/compensation circuit is arranged to detect the output voltage, and transfer it to a controller of the voltage source. Thus, any change in the output voltage may be dynamically compensated. However, the addition of the feedback/compensation circuit may introduce some other issues, such as bandwidth, and/or response time, etc.

SUMMARY

Certain aspects of the present disclosure and their embodiments may provide solutions to these or other challenges. There are, proposed herein, various embodiments which address one or more of the issues disclosed herein.

A first aspect of the present disclosure provide a circuit for compensating an output of a voltage source, comprises: a sensing unit, a first adjustment unit, an amplifier unit, and a second adjustment unit; the sensing unit is coupled between the output of the voltage source and a first input terminal of an amplifier in the amplifier unit; and the sensing unit is configured to transfer the output of the voltage source to the amplifier; the first adjustment unit is coupled in parallel with the sensing unit, and configured to generate at least one pole point and/or at least one zero point in a transfer function of the circuit; a second input terminal of the amplifier in the amplifier unit is coupled to a reference voltage; and the second adjustment unit is coupled in parallel with a resistor between an output of the amplifier and a controller of the voltage source, and the second adjustment unit is configured to generate at least one zero point in the transfer function of the circuit.

In embodiments of the present disclosure, the transfer function of the circuit comprises at least one of: a zero point to compensate a LC resonant pole point of a transfer function of a power stage of the voltage source; a zero point lower than the LC resonant pole; a zero point around an original gain crossover frequency of the transfer function of the circuit; the original gain crossover frequency is determined when the first adjustment unit and the second adjustment unit is removed; a zero point higher than a pole point, which is higher than a targeted gain crossover frequency; a pole point to compensate a zero point related to an Equivalent Series Resistance, ESR, of a output capacitor of the power stage; or a pole point at a switching frequency of the voltage source.

In embodiments of the present disclosure, the circuit further comprises: a threshold unit, coupled with the first adjustment unit in series; the threshold unit is configured to be turned on when a ripple of the output of the voltage source is greater than a predefined threshold and to be turned off when the ripple of the output of the voltage source is less than the predefined threshold.

In embodiments of the present disclosure, the threshold unit comprises at least one of: a diode, or a transistor.

In embodiments of the present disclosure, the threshold unit comprises an antiparallel diode pair.

In embodiments of the present disclosure, the sensing unit comprises: a resistor and a capacitor in series; and another resistor coupled in parallel with the resistor and the capacitor in series.

In embodiments of the present disclosure, the first adjustment unit comprises a resistor and a capacitor in series.

In embodiments of the present disclosure, the second adjustment unit comprises a capacitor.

In embodiments of the present disclosure, the second adjustment unit is coupled to the controller of the voltage source via an opto-coupler.

In embodiments of the present disclosure, the first input terminal of the amplifier is further coupled to a ground via a resistor.

In embodiments of the present disclosure, the first input terminal is an inverting input terminal, and the second input terminal is a noninverting input terminal.

In embodiments of the present disclosure, wherein the voltage source is a DC/DC voltage source.

A second aspect of the present disclosure provide a voltage source comprises: a power stage, a controller, and the circuit, the power stage is configured to generate the output of the voltage source; the circuit is configured to generate a feedback to the controller, based on the output of the voltage source; and the controller is configured to control the power stage, based on the feedback from the circuit.

In embodiments of the present disclosure, the power stage comprises an isolator between the DC input voltage and the DC output voltage; and the voltage source comprises another isolator between the circuit and the controller.

In embodiments of the present disclosure, the power stage is configured to convert a DC input voltage to a DC output voltage.

In embodiments of the present disclosure, the voltage source is arranged for a power amplifier in wireless device.

A third aspect of the present disclosure provide a method for compensating an output of a voltage source, performed by the circuit, the method comprises: sensing and transferring the output of the voltage source to the amplifier in the amplifier unit; comparing the output of the voltage source and a reference voltage to generate a differential voltage; and transferring the differential voltage to the controller of the voltage source.

According to embodiments of the present disclosure, the first adjustment unit, and the second adjustment unit are arranged for generating additional zero points and pole points in the transfer function of the voltage source, so as to obtain a higher loop bandwidth. Other parts of the voltage source or the circuit system to which the voltage belongs need not to be redesigned. The efficiency is greatly improved.

BRIEF DESCRIPTION OF DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1A:
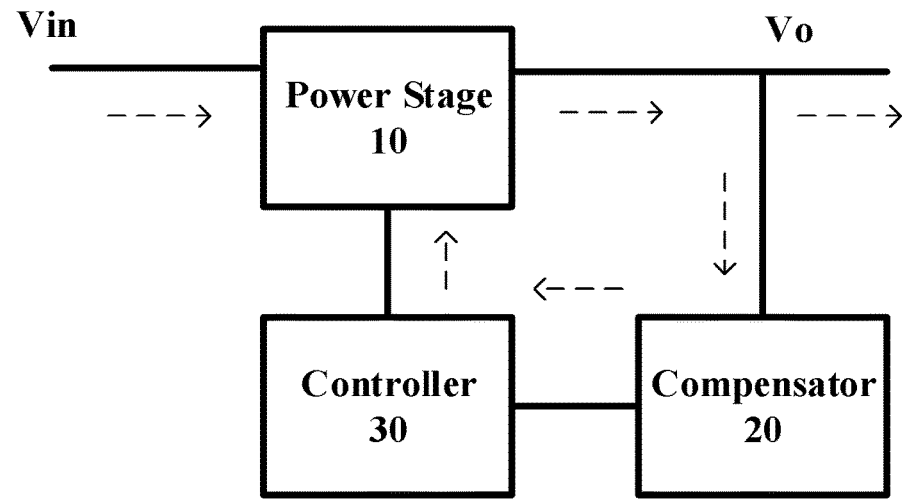
FIG. 1A is an exemplary block diagram showing a voltage source, in which a circuit and a method according to embodiments of the present disclosure may be implemented.

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

As used herein, the terms "first", "second" and so forth refer to different elements. The singular forms "a" and "an" are intended to include the plural forms as well, unless the context clearly indicates otherwise. The terms "comprises", "comprising", "has", "having", "includes" and/or "including" as used herein, specify the presence of stated features, elements, and/or components and the like, but do not preclude the presence or addition of one or more other features, elements, components and/or combinations thereof. The term "based on" is to be read as "based at least in part on". The term "one embodiment" and "an embodiment" are to be read as "at least one embodiment". The term "another embodiment" is to be read as "at least one other embodiment". Other definitions, explicit and implicit, may be included below.

The term 'unit' may have conventional meaning in the field of electronics, electrical devices and/or electronic devices and may include, for example, electrical and/or electronic circuitry, modules, processors, components for carrying out respective tasks, procedures, computations, outputs, and/or any other kinds of signal converting/processing, and so on, as such as those described herein.

FIG. 1A is an exemplary block diagram showing a voltage source, in which a circuit and a method according to embodiments of the present disclosure may be implemented. Dashed lines in the FIG. 1A is only used to illustrate a logic direction of electric signals concerning the feedback control, for better illustrating.

As shown in FIG. 1A, basically, the voltage source (i.e. power converter) includes three parts: a power stage 10, a compensator 20, and a controller 30. The power stage is arranged to convert the input voltage Vin to the output voltage Vo. The output voltage Vo may usually have a predetermined value. The compensator 20 is arranged to detect/sense the output voltage Vo, and transfer it to a controller 30 of the voltage source. The controller 30 will control the power stage 10 according to detected output voltage Vo. Thus, any change in the output voltage may be dynamically compensated.

In embodiments of the present disclosure, wherein the voltage source is a DC/DC voltage source, particularly isolated DC/DC voltage source. In embodiments of the present disclosure, the power stage 10 is configured to convert a DC input voltage to a DC output voltage.

Figure 1B:
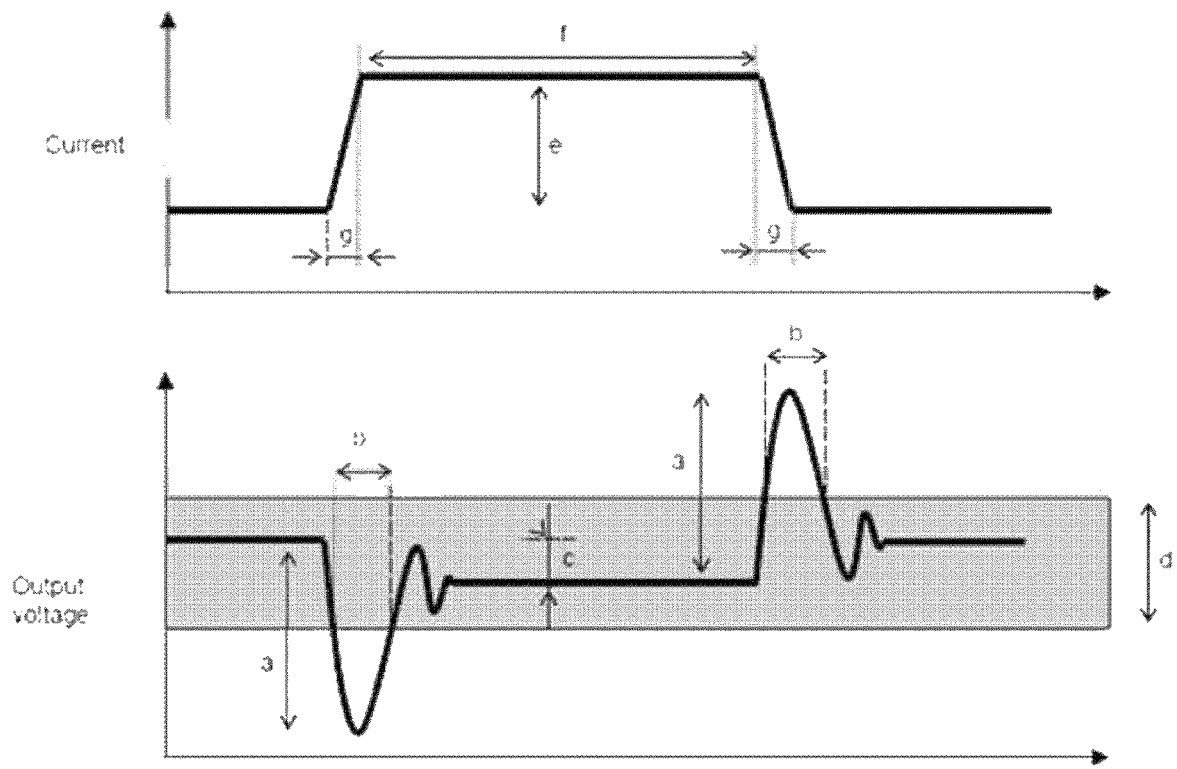
FIG. 1B is an exemplary diagram showing a change in the output voltage of the voltage source due to a change of the load.

FIG. 1B is an exemplary diagram showing a change in the output voltage of the voltage source due to a change of the load.

As shown in FIG. 1B, a dynamic response to a step load may be used to illustrate a performance of the voltage source as shown in FIG. 1A. Due to a pulse-type (step) change in the current as shown in the upper part of the FIG. 1B, an oscillation may occur at output voltage as shown in the FIG. 1B.

The reference signs in the FIG. 1B are listed in the following table.

| | | |
|---|---|---|
| a | Peak voltage deviation | Maximum voltage of the under- or overshoots Referred to the voltage before the step loads occur. |
| b | Settling time | The time for the under- or overshoot voltages to return to a voltage within the tolerance band |
| c | Line & Load regulation | The output voltage variations due to static load changes and input voltage variations |
| d | DC output voltage tolerance band | Output voltage, measured as a DC-average voltage. Conditions: Output current $I_{min}$ to $I_{max}$, Input voltage range and and long term drift. |
| e | Current step | Load changes |
| f | Duration | The time duration of the different current levels. When applicable, specify repetition frequencies. |
| g | Rise/fall time | The slopes of the current steps |

Generally, a possible minimum "b" and a possible minimum "a" is desired.

The following equations are used to describe such response procedure, particularly concerning the peak voltage deviation.

$$Q_{cap\_discharge} = Cout \cdot \Delta V$$

$$Q_{load\_needed} = \Delta Io \cdot t_{response}$$

$$Q_{cap\_discharge} = Q_{load\_needed}$$

$$Cout \cdot \Delta V = \Delta Io \cdot t_{response}$$

$$\Delta V = \frac{\Delta Io \cdot t_{response}}{Cout}$$

In the equations, Cout is the output capacitance of the voltage source;

$\Delta V$ is peak voltage deviation of the output voltage Vo;

$\Delta Io$ is the change of output current;

$t_{response}$ is the response time converter loop (i.e. voltage source loop). Basically, this time is between 2-10 switching periods depending on loop crossover frequency.

According to the above equations, two basic ways may exist to improve dynamic response, particularly to minimize the "$\Delta V$", namely, either to increase output capacitance Cout or decrease loop response time $t_{response}$.

1. Cout may be increased. Then bulky capacitors are needed, and thus the cost and space of the voltage source are to be increased.

2. $t_{response}$ may be shortened based on a fixed PWM controller and topology.

2.1 Higher switching frequency may be designed. This will lead to higher switching power loss and hard to be implemented on high output power bus converter.

2.2 Higher control loop bandwidth (crossover frequency) may be designed. However, the loop bandwidth is limited by phase margin. It is hard to maintain enough phase margin with traditional loop compensator to make converter stable and reliable.

Additionally, some special control scheme when dynamic load happens may be utilized, for example: COT (Constant On Time). However, these special control schemes may be exclusive and only implemented by specific controllers.

Figure 1C:
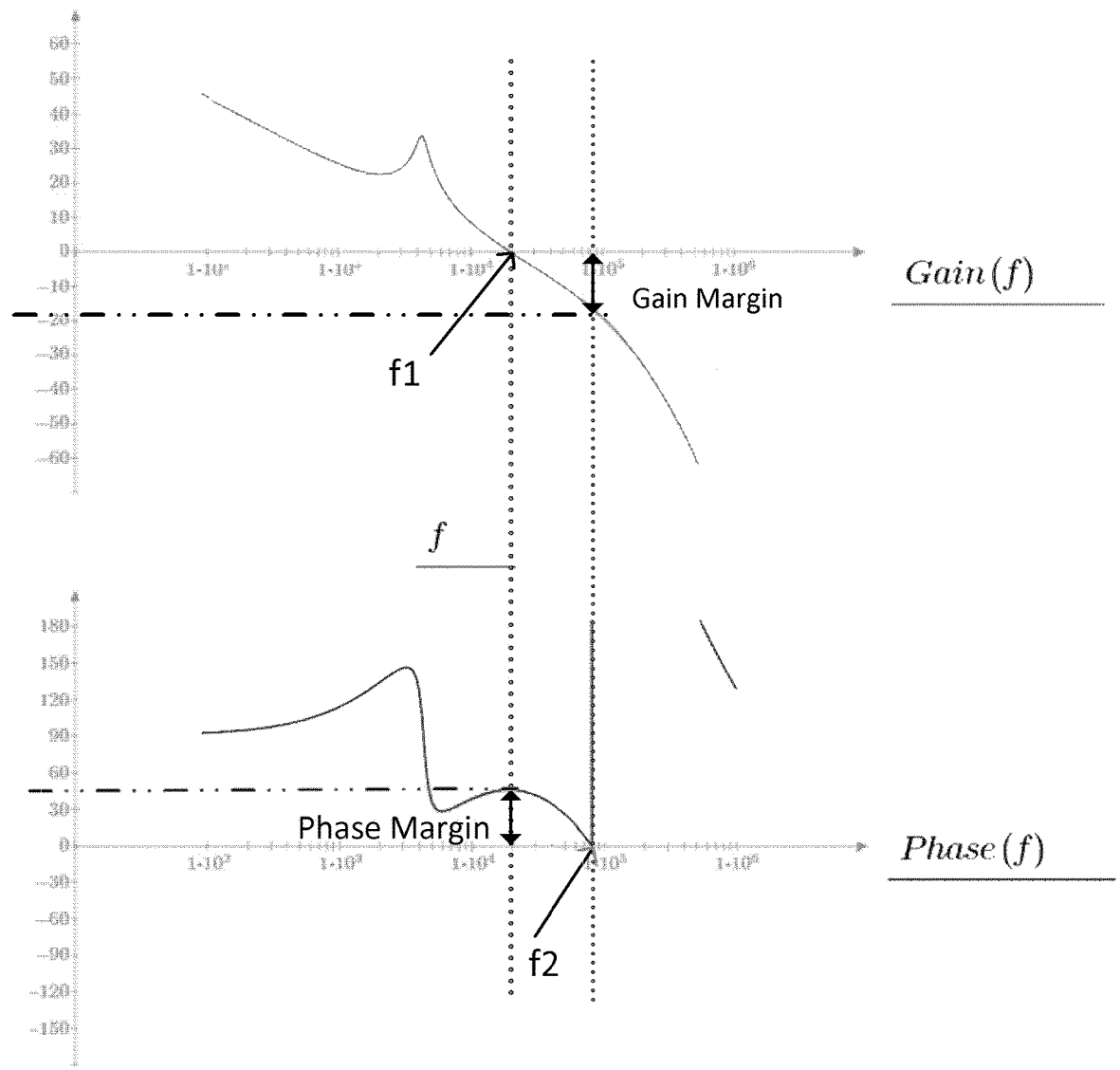
FIG. 1C is an exemplary Bode plot, including gain plot and phase plot, of the voltage source as shown in FIG. 1A.

FIG. 1C is an exemplary Bode plot, including gain plot and phase plot, of the voltage source as shown in FIG. 1A.

In the plot, a gain crossover frequency f1 satisfies: Gain (f1)=0 dB; a phase crossover frequency f2 satisfies: Phase (f2)=0°; gain margin=Gain(f2)−Gain(f1), phase margin=Phase(f1)−Phase(f2).

When the loop stability is concerned, the rule of thumb for loop stability may be applied: Gain margin>10 dB; Phase margin>45°.

As shown in the FIG. 1C, the gain crossover frequency f1 is 20 KHz, the phase crossover frequency f2 is 81 KHz, and thus gain margin is 16 dB, the phase margin is just 45°.

A higher gain cross over frequency may correspond to a higher bandwidth, but the phase will drop after f1, so it is hard to maintain stability margin if putting gain cross over frequency higher than f1 without changing loop circuit. Thus, it is hard to get higher f1 and bigger phase margin at the same time, although they may indicate the better output dynamic performance.

Based on following analysis and embodiments, the present disclosure may provide an efficient manner to arrange a compensator for the voltage source.

Each part as shown in FIG. 1A could be depicted as a frequency-related transfer function in frequency domain.

The transfer function is a function expression in time domain transformed by Laplace method to s domain (s=2*pi*f, or frequency domain). Its mathematical meaning is: transfer function G (s)=output signal A (s)/input signal B (s).

The expressions that zero points of output signal (s)/transfer function, pole points of input signal (s)/transfer function, Bode diagram, crossing frequency/crossover frequency, amplitude margin and phase margin, may be all discussed based on the concept of s-domain, and/or frequency domain.

The output signal of compensator is Vcomp (s) and the input signal is Vo (s), so the transfer function of compensator is G (s)=Vcomp (s)/Vo (s).

That is, the total control open loop transfer function from Vin to Vo may be defined as: Gopenloop(f)=Gpower stage (f)*Gcompensator(f)*Gcontroller(f).

To make the converter stable and meet required output performance, Gcompensator(f) need to adjust its' parameters since power stage and controller are usually fixed.

Gopenloop(f) could be further rewritten in pole and zero form:

$$Gcompensator(f) = K0 \cdot \frac{\left(1+\frac{f}{fz1}\right) \cdot \left(1+\frac{f}{fz2}\right) \cdot \left(1+\frac{f}{fz3}\right) \cdot \left(1+\frac{f}{fz4}\right) \cdots \left(1+\frac{f}{fzm}\right)}{fp1 \cdot \left(1+\frac{f}{fp2}\right) \cdot \left(1+\frac{f}{fp3}\right) \cdot \left(1+\frac{f}{fp4}\right) \cdots \left(1+\frac{f}{fpn}\right)},$$

wherein K0 is the scale factor; fp1, fp2 . . . fpn is the pole frequency of specific points, fz1, fz2, . . . , fzm is the zero frequency of specific points. Zero (point) is at function's numerator part, and Pole (point) is at denominator. At zero frequency, phase will be increased by 45°. After zero, gain will be increased by 20 dB every frequency increases 10 times. At pole frequency, phase will be decreased by 45°. After pole, gain will be decreased by 20 dB every frequency increases 10 times. Zero and pole could cancel each other.

Zero's and pole's frequency locations of the Gcompensator(f) have to be placed properly to compensate Gpowerstage(f) and Gcontroller(f) to achieve required stability margin and output performance.

Theoretically, pole will have 45 degree phase lag at its frequency (90 degree lag ultimately), whereas zero will have 45 degree phase lead at its' frequency (90 degree lead ultimately). Traditional loop compensator, such as type II or type III compensator usually will ultimately have 90 degree phase lag. The reason of the 90 degree phase lag of traditional compensators is pole points outnumber zero points. The phase lag will decrease phase margin thus limit the control loop's crossover frequency range.

If loop compensator's zero's number equals to pole's number, zero degree phase lag compensator may be generated. The loop compensator may provide much more flexibility to raise control loop's crossover frequency and make the control loop stable/have enough phase margin.

Following embodiments provide manner to add one zero into control loop to generate zero degree phase lag compensator. Enough phase margin may be obtained as the base for the whole control loop stability.

Figure 2A:
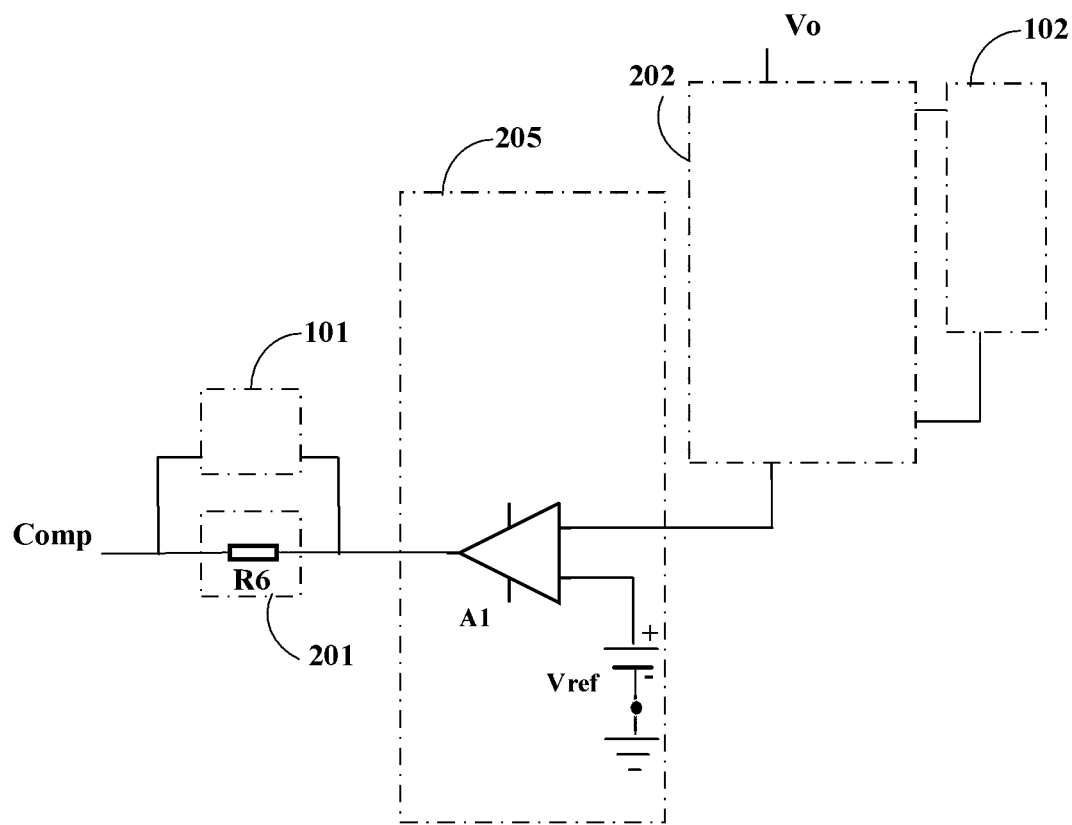
FIG. 2A is an exemplary block diagram of the compensator as shown in FIG. 1A, according to embodiments of the present disclosure.
Figure 2B:
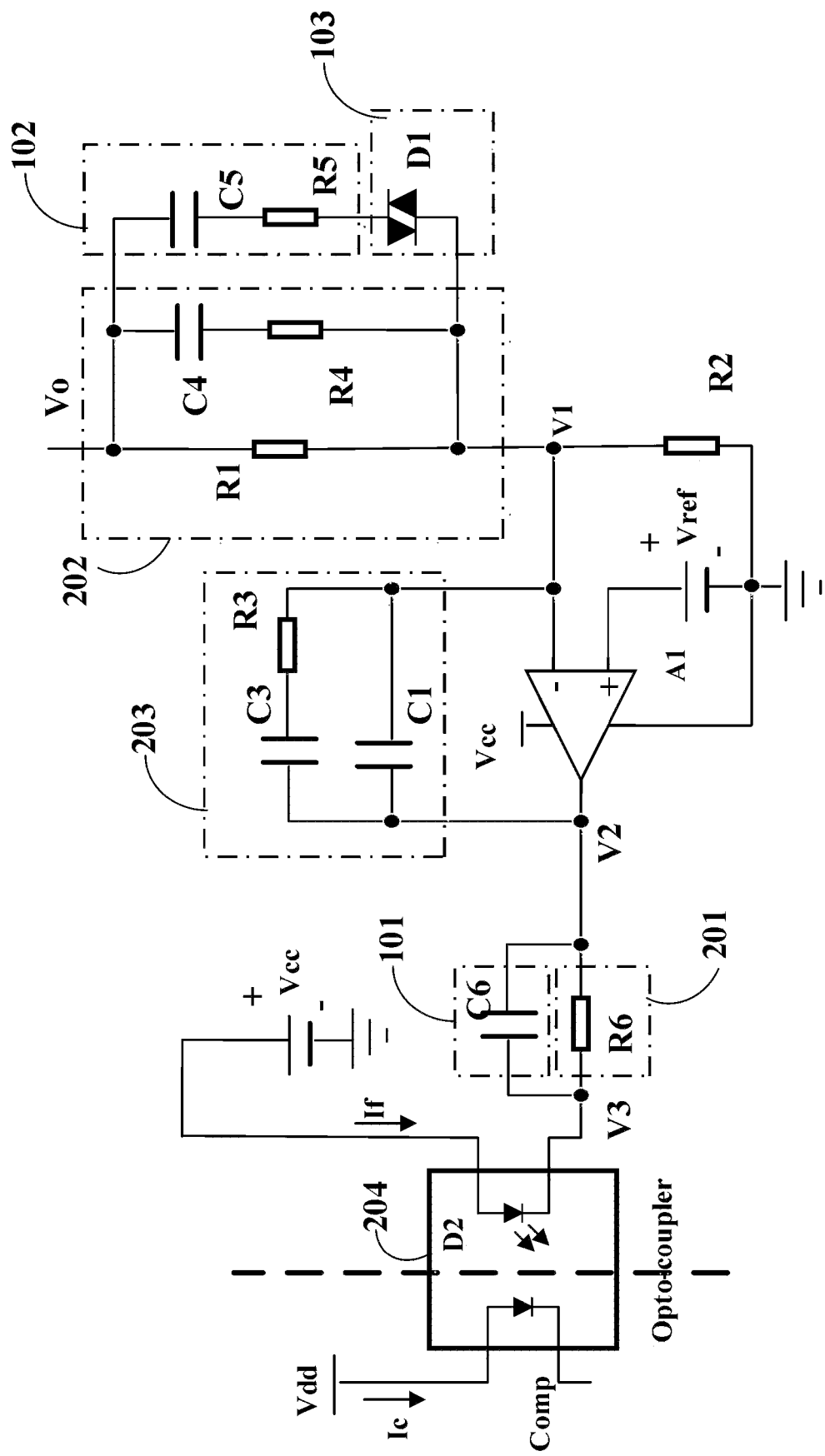
FIG. 2B is an exemplary circuit diagram of the compensator as shown in FIG. 1A, according to embodiments of the present disclosure.

FIG. 2A is an exemplary block diagram of the compensator as shown in FIG. 1A, according to embodiments of the present disclosure. FIG. 2B is an exemplary circuit diagram of the compensator as shown in FIG. 1A, according to embodiments of the present disclosure.

As shown in FIG. 2A, a circuit (i.e. the compensator) 20 for compensating an output Vo of a voltage source comprises: a sensing unit 202, a first adjustment unit 102, an amplifier unit 205, and a second adjustment unit 101; the sensing unit 202 is coupled between the output Vo of the voltage source and a first input terminal of an amplifier A1 in the amplifier unit 205; and the sensing unit 202 is configured to transfer the output of the voltage source to the amplifier A1; the first adjustment unit 102 is coupled in parallel with the sensing unit 202, and configured to generate at least one pole point and/or at least one zero point in a transfer function of the circuit 20; a second input terminal of the amplifier A1 in the amplifier unit 205 is coupled to a reference voltage Vref; and the second adjustment unit 101 is coupled in parallel with a resistor R6 between an output of the amplifier A1 and a controller 30 of the voltage source, and the second adjustment unit 101 is configured to generate at least one zero point in the transfer function of the circuit 20.

According to embodiments of the present disclosure, the first adjustment unit 102, and the second adjustment unit 101 are arranged for generating adjustable zero points and pole points in the transfer function of the voltage source, so as to obtain a higher loop bandwidth. Other parts of the voltage source or the circuit system to which the voltage belongs need not to be redesigned. The efficiency is greatly improved.

As shown in FIG. 2B, in embodiments of the present disclosure, the first adjustment unit 102 comprises a resistor R5 and a capacitor C5 in series.

In embodiments of the present disclosure, the second adjustment unit 101 comprises a capacitor C6.

That is, in embodiments of the present disclosure, a capacitor unit 101 may be used to generate an additional zero with 201 in feedback control loop. A RC series circuit unit 102 may be used to generate one more pole and one more zero together with 202. The circuit unit 102 may be properly configured to boost the bandwidth/crossover frequency higher.

It should be understood, any kind of electric components may be used for the first adjustment unit 102, and the second adjustment unit 101. For example, more resistors or more capacitors, either in series or in parallel, may be utilized, for any desired number of pole points or zero points.

As shown in FIG. 2B, in embodiments of the present disclosure, the circuit 20 further comprises: a threshold unit 103, coupled with the first adjustment unit 102 in series; the threshold unit 103 is configured to be turned on when a ripple of the output of the voltage source is greater than a predefined threshold and to be turned off when the ripple of the output of the voltage source is less than the predefined threshold.

In embodiments of the present disclosure, the threshold unit 103 comprises at least one of: a diode, or a transistor.

In embodiments of the present disclosure, the threshold unit 103 comprises an antiparallel diode pair D1.

For example, a threshold may be set as ±0.3V and the set point of Vo may be 10V, when Vo changes above 10.3V or below 9.7V due to load current change, the threshold unit 103 will be turned on.

It should be understood that the threshold circuit unit 103 may be any kind of threshold components or short circuits. The threshold component could be Diode, Zener, a transient voltage suppressor (TVS), Metal-Oxide-Semiconductor Field-Effect Transistor (MOSFET), transistor and other components with single/bi direction conductivity with any bias voltage.

According to embodiments of the present disclosure, the first adjustment unit 102 may operate selectively, so as to balance the suppression of the ripple of the output voltage and the response time.

In embodiments of the present disclosure, the sensing unit 202 comprises: a resistor R4 and a capacitor C4 in series; and another resistor R1 coupled in parallel with the resistor R4 and the capacitor C4 in series.

In embodiments of the present disclosure, the second adjustment unit 101 is coupled to the controller 30 of the voltage source via an opto-coupler D2, as an isolator.

In embodiments of the present disclosure, the first input terminal of the amplifier A1 is further coupled to a ground via a resistor R2.

In embodiments of the present disclosure, the first input terminal is an inverting input terminal, and the second input terminal is a noninverting input terminal.

It should be understood that any other kinds of electric structures may alternatively be utilized for the sensing unit 202, the amplifier unit 205, or etc.

Corresponding to the FIG. 2B, the compensator transfer function from Vo to Ic may be presented as:

$$Gcompensator(s) = \\ Z204(s) * \frac{Z101(s) + Z201(s)}{Z101(s) * Z201(s)} * \frac{Z203(s) * (Z202(s) + Z102(s))}{Z202(s) * Z102(s)},$$

wherein s=2*π*f, CTR is opto-coupler D2's Current Transfer Ratio, "Z" means a transfer function for any unit.

For comparison and better illustration, three specific embodiments will be introduced as follows.

$$Gcompensator\_original(s) = \\ CTR * \frac{1}{R6} * \frac{(R3*C3*s+1)*((R1+R4)*C4+1)}{s*R1*C3*(R4*C4^*s+1)^*(R3*C1*s+1)},$$

as (1), produces 2 zeros and 3 poles.

The "original" means that the first adjustment unit 102, the second adjustment unit 101, and the threshold unit 103 are removed.

$$Gcompensator\_add101(s) = \\ CTR * \frac{(R6*C6*s+1)}{R6} * \frac{(R3*C3*s+1)*((R1+R4)*C4+1)}{s*R1*C3*(R4*C4^*s+1)^*(R3*C1*s+1)},$$

as (2), produces 3 zeros and 3 poles.

The "add101" means that the second adjustment unit 101 is added, but the first adjustment unit 102, and the threshold unit 103 are removed.

$$Gcompensator\_add101\_102\_103(s) = \\ CTR * \frac{(R6*C6*s+1)}{R6} * \frac{(R3*C3*s+1)*(s^2*(R1*C4*C5*(R4+R5)+R4*R5*C4*C5)+s*(R1*(C4+C5)-R4+C4+R5*C5)+1)}{s*R1*C3*(R4*C4^*s+1)^*(R3*C1*s+1)*(R5*C5*s+1)},$$

as (3), produces 4 zeros and 4 poles.

The "add101_102_103" means that the first adjustment unit 102, the second adjustment unit 101, and the threshold unit 103 are added.

In embodiments of the present disclosure, the transfer function of the circuit comprises at least one of:

a zero point to compensate a LC resonant pole point of a transfer function of a power stage of the voltage source;

a zero point lower than the LC resonant pole;

a zero point around an original gain crossover frequency of the transfer function of the circuit; the original gain crossover frequency is determined when the first adjustment unit and the second adjustment unit is removed;

a zero point higher than a pole point, which is higher than a targeted gain crossover frequency; here both the zero and pole may be placed higher than targeted crossover frequency to minimize the influence on phase margin and magnitude margin. For example, in real design (80 KHz crossover frequency), the pole is placed at 100 KHz to have more magnitude margin, the zero is place at 150 KHz to compensate some phase decreased by the 100 KHz pole. So the placement of the zero and pole should consider the total influence on magnitude margin and phase margin;

a pole point to compensate a zero point related to an Equivalent Series Resistance, ESR, of a output capacitor of the power stage; or a pole point at a switching frequency of the voltage source.

Particularly, for original compensator, it may be designed to put two zeros around power stage LC resonant double poles, to put one pole to compensate power stage output capacitor ESR zero, and to put one pole at switching frequency to dampen switching noise.

For the compensator, such as shown in FIG. 2A, 2B, it may be designed to put one zero to compensate one of power stage LC resonant pole; to put one zero lower than LC resonant pole to obtain more gain; to put one zero around original gain crossover frequency; to put one zero to cancel one pole; to put one pole to compensate power stage output capacitor ESR zero; and to put one pole at switching frequency to dampen switching noise. LC resonant may be caused by inductance and capacitor in the power stage.

For example, it may be assumed that the LC resonant double pole of power stage is 5 KHz, the ESR zero point of output capacitor is 100 kHz, and the switching frequency is 200 kHz. Then, two zeros of the transfer function of the compensator are related to the position of LC resonance point of power stage and placed near 5 KHz (equal to 5 KHz, or has a predetermined difference value to 5 KHz), one pole of the denominator of the transfer function is placed near 100 kHz (related to ESR zero point of output capacitor), one pole is placed near 200 kHz (related to the switching frequency of the converter), and the other pole may be 0 Hz.

After setting the zero, pole frequency, for example, to configure a frequency value of 150 kHz composed of R3C3, is just to make 150 kHz=1/(2*π*R3*C3). In this equation, R3 may be in ohmic value, C3 may be in capacitance value.

It should be noted that R3 and C3 are both in the numerator and denominator, they interact with each other, and the calculation method could be in iterative form, cyclic form, etc.

However, a manner may be provided roughly to confirm the all R and C: since the reference voltage of amplifier A1 is known, the output voltage Vo is known, and the reference R2 may be selected first, then R1=(Vo/Vref−1)*R2. Then, C3 may be deduced according to the frequency point of the desired crossover frequency fcross according to the corresponding formula, and R3 may be confirmed according to the LC resonance point. Since a pole is placed at the switch frequency and R3 is known, then C1 can be calculated. Another pole is placed at the zero point of ESR, and C4 can be deduced. Then, R4 may be determined. R6 is the current limiting resistance of optocoupler. The value can be calculated, and then the zero point generated by R6, C6 is placed at the desired crossover frequency. That is, R6 is known, and the position of the zero point to be placed is known, then C6=1/(2*π*Fz*R6).

According to embodiments of the present disclosure, specific manner of arranging the zero points and pole points may be provided. The bandwidth may become higher while keeping enough phase margin by equaling compensator's zeros and poles. The output dynamic response will be improved.

Further, such advantages may be achieved by adding several relatively cheap components (such as resistors and capacitors) and easy to be implemented on existing design.

For example, in practice, the original compensator and the transfer function thereof, Gcompensator_original(s), may be firstly designed and determined.

If the performance (such as the gain crossover frequency) is already high enough, the first adjustment unit and the second adjustment unit may be not necessary.

If not enough, any adjustment unit, such as the second adjustment unit 101, may be added. Then, the parameters of the electric components in the adjustment unit may be selected, and the parameters of the original units may be further adjusted if necessary, based on above manners, so as to obtain better performance.

Figure 2C:
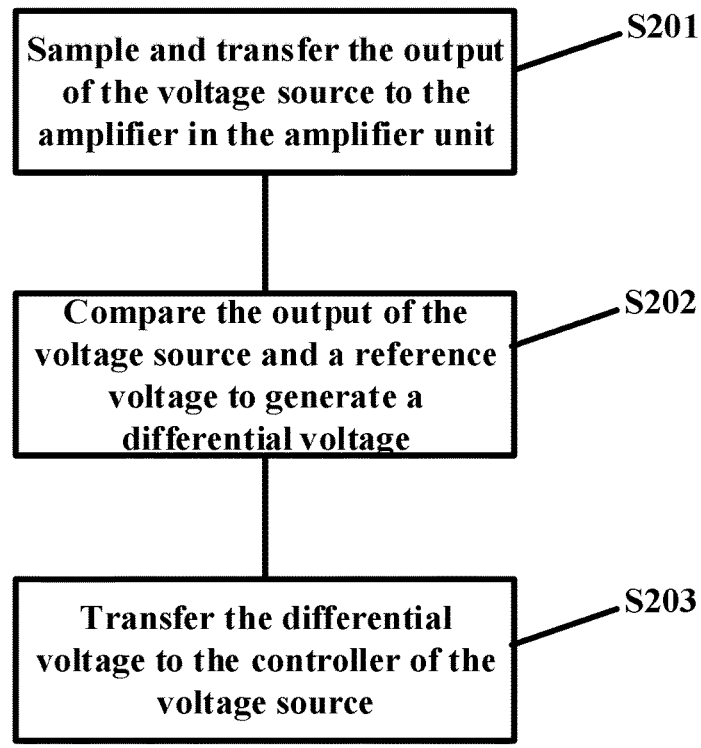
FIG. 2C is an exemplary flow chart showing a method for compensating an output of a voltage source, performed by the circuit.

FIG. 2C is an exemplary flow chart showing a method for compensating an output of a voltage source, performed by the circuit.

As shown in FIG. 2C, the method comprises: S201, sensing and transferring the output of the voltage source to the amplifier in the amplifier unit; S202, comparing the output of the voltage source and a reference voltage to generate a differential voltage; and S203, transferring the differential voltage to the controller of the voltage source.

Figure 3:
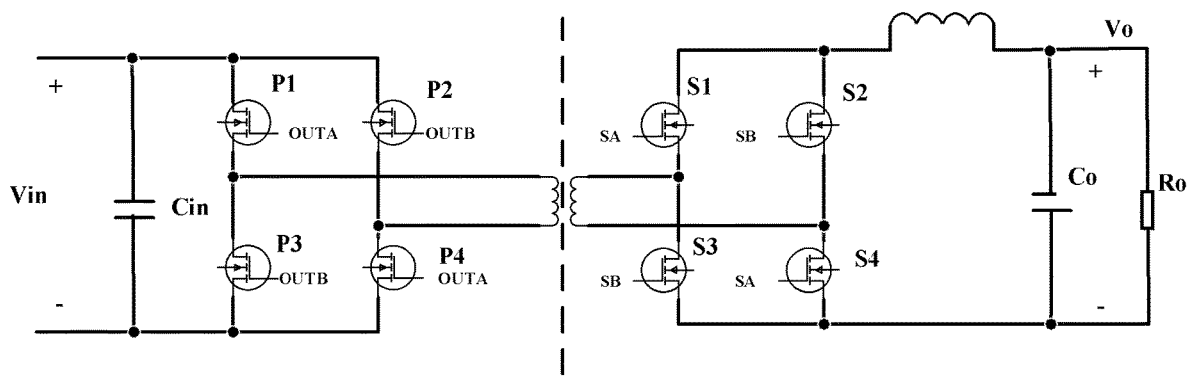
FIG. 3 is an exemplary diagram of the power stage as shown in FIG. 1A.

FIG. 3 is an exemplary diagram of the power stage as shown in FIG. 1A.

As shown in FIG. 3, the power stage 10 may utilize several transistors P1, P2, P3, P4 controlled by the controller 30 (specifically, terminals OUTA, OUTB) to invert an DC input voltage Vin to AC voltage, and then the AC voltage is transferred by a AC/AC transformer (i.e. an isolator). Then, the power stage 10 may utilize several transistors S1, S2, S3, S4 controlled by the controller 30 (specifically, terminals SA, SB) to rectify the AC voltage to a DC output voltage Vo. The Cin is the input capacitor, the Co is the output capacitor, and the Ro is the output resistor.

Figure 4:
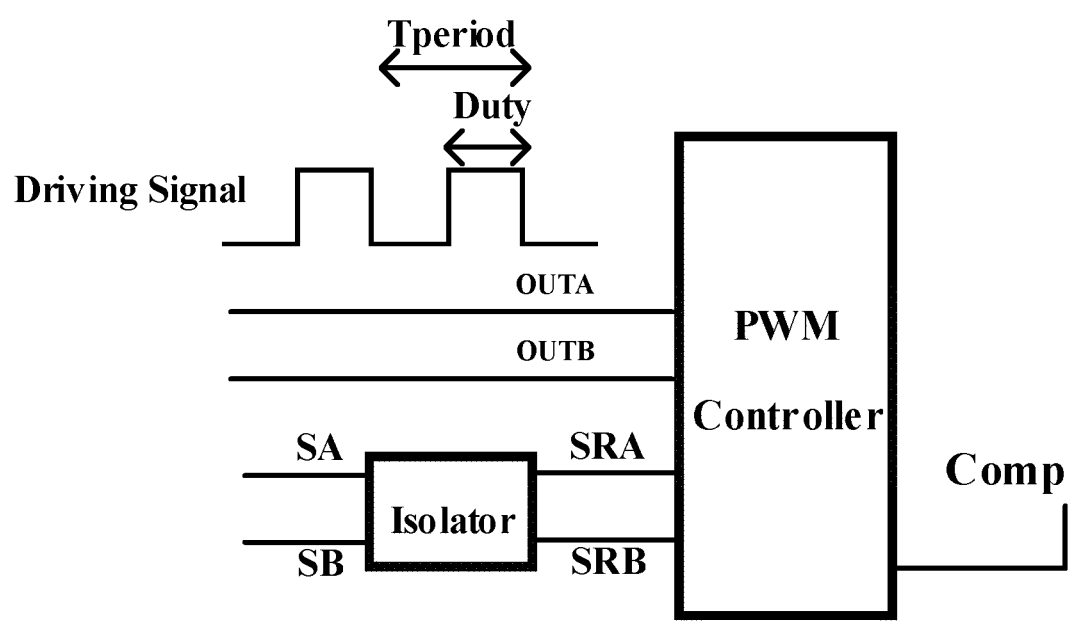
FIG. 4 is an exemplary diagram of the controller as shown in FIG. 1A.

FIG. 4 is an exemplary diagram of the controller as shown in FIG. 1A.

As shown in FIG. 4, the controller 30 may be a PWM controller, receiving driving signals. The driving signals may be square wave with specific period Tperiod and specific duty Duty. The controller may receive feedback Comp from the compensator 20, and then output control signal OUTA, OUTB, SA, and SB to the transistors in the power stage 10. Isolator may be also arranged between the controller and the transistor, for example, between terminals "SRA, SRB" and "SA, SB".

In embodiments of the present disclosure, the voltage source is particularly arranged for a power amplifier in wireless device, which may desire a higher frequency bandwidth.

Figure 5A:
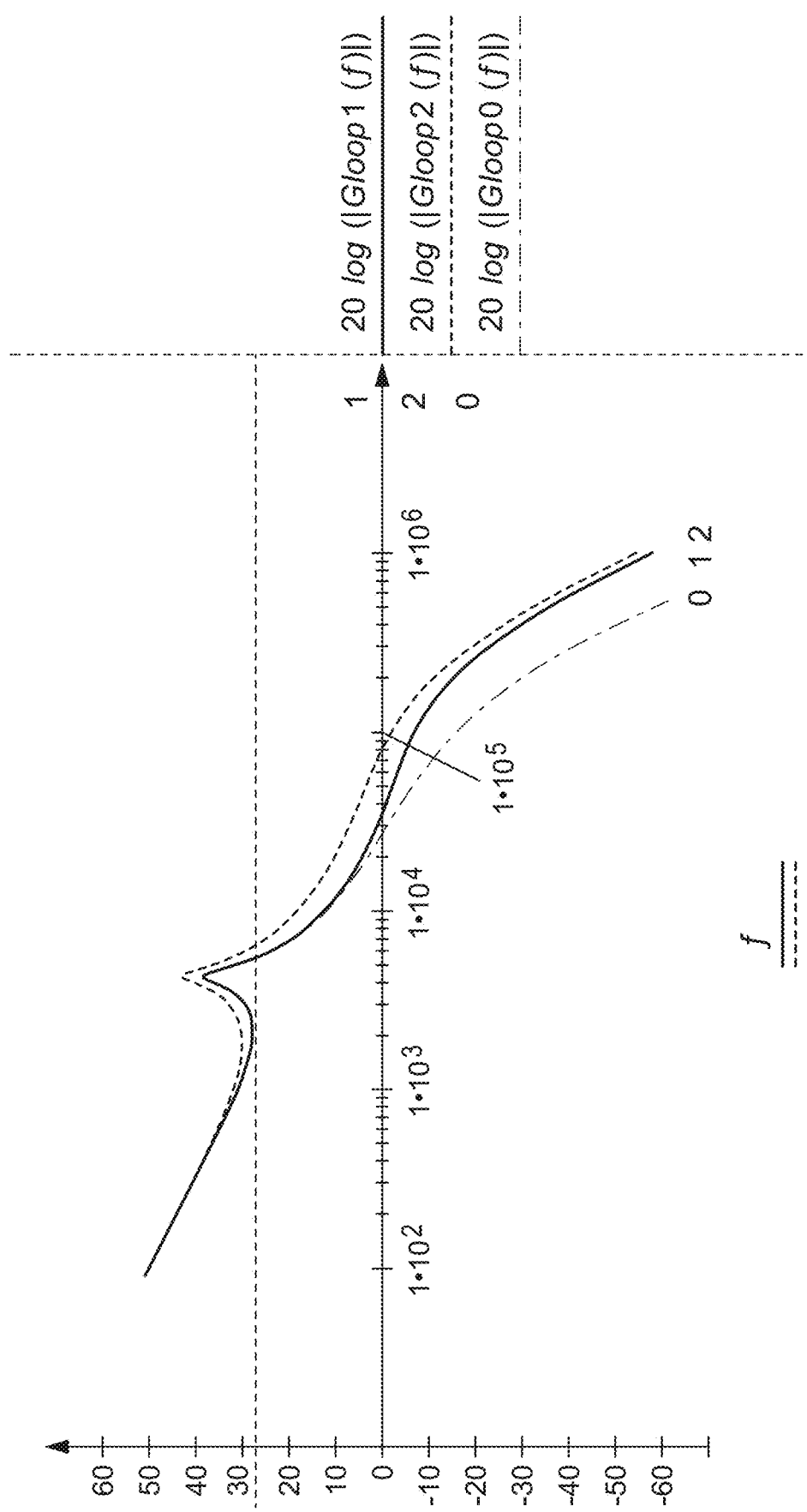
FIG. 5A is an exemplary Bode plot, including gain plot, according to different embodiments of the present disclosure.
Figure 5B:
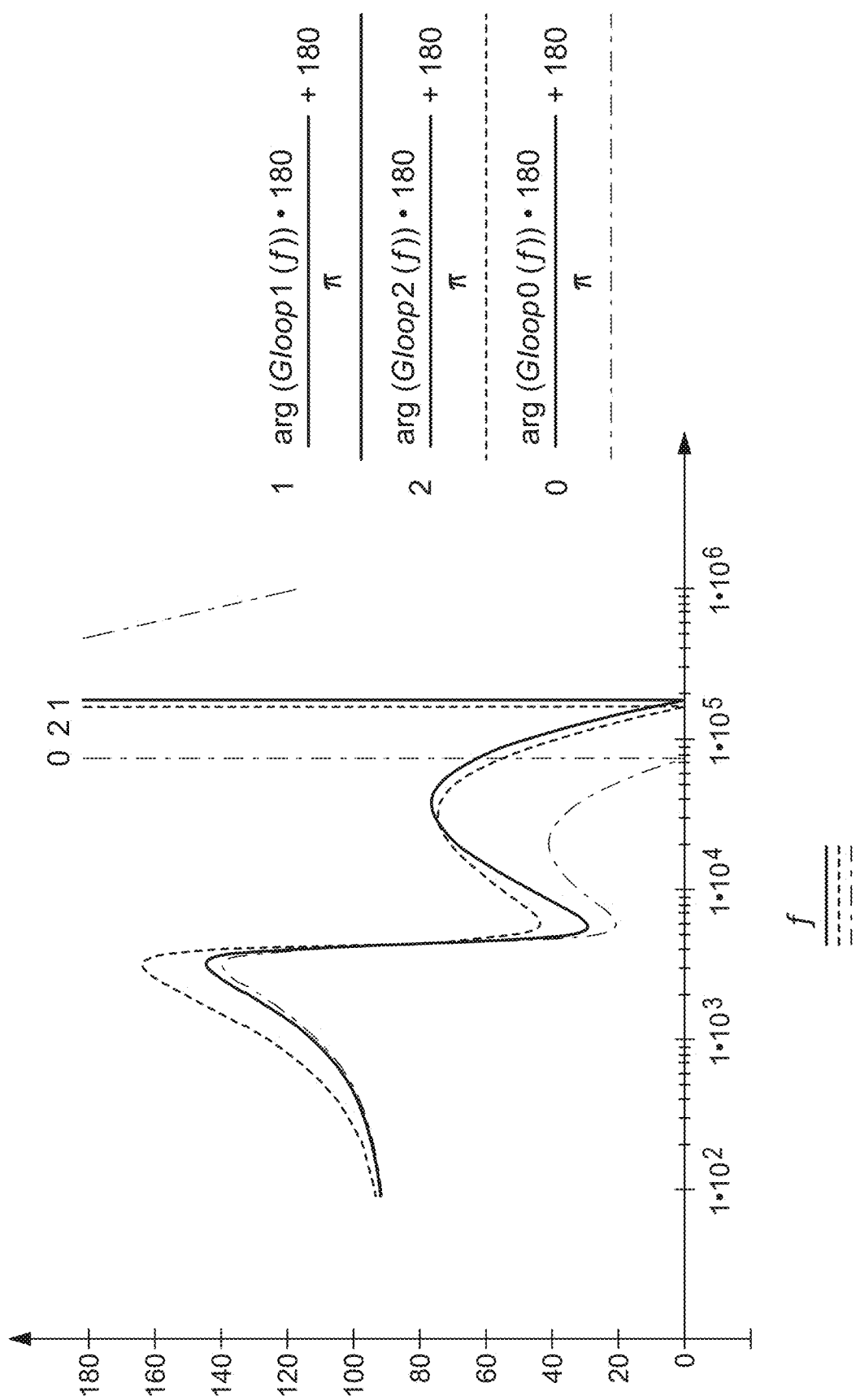
FIG. 5B is an exemplary Bode plot, including phase plot, according to different embodiments of the present disclosure.

FIG. 5A is an exemplary Bode plot, including gain plot, according to different embodiments of the present disclosure. FIG. 5B is an exemplary Bode plot, including phase plot, according to different embodiments of the present disclosure.

As to one exemplary 55V power cell, three openloop bode plots are depicted, which are for Original Loop (without adjustment unit or threshold unit), referred as "0" in the figures, Loop with second adjustment unit 101 only, referred as "1" in the figures, and Loop with second adjustment unit 101, first adjustment unit 102 and threshold unit 103 (short), referred as "2" in the figures.

For the original Loop, "0", crossover frequency is 27 KHz, phase margin 39°. Loop with unit 101 only, "1", crossover frequency is 34 KHz, phase margin 74°. Loop with unit 101, unit 102 and unit 103 (short), "2", crossover frequency is 80 KHz, phase margin 52°.

Comparably, for the Original loop phase, margin will become 0° at 75 KHz, for the Loop with unit 101 only, loop phase margin is increased by 35°.

That is, both crossover frequency and the phase margin may be increased compared to the original loop. And even a very high crossover frequency (i.e. bandwidth) "80 KHz" is obtained, the phase margin is still ensured.

Figure 6A:
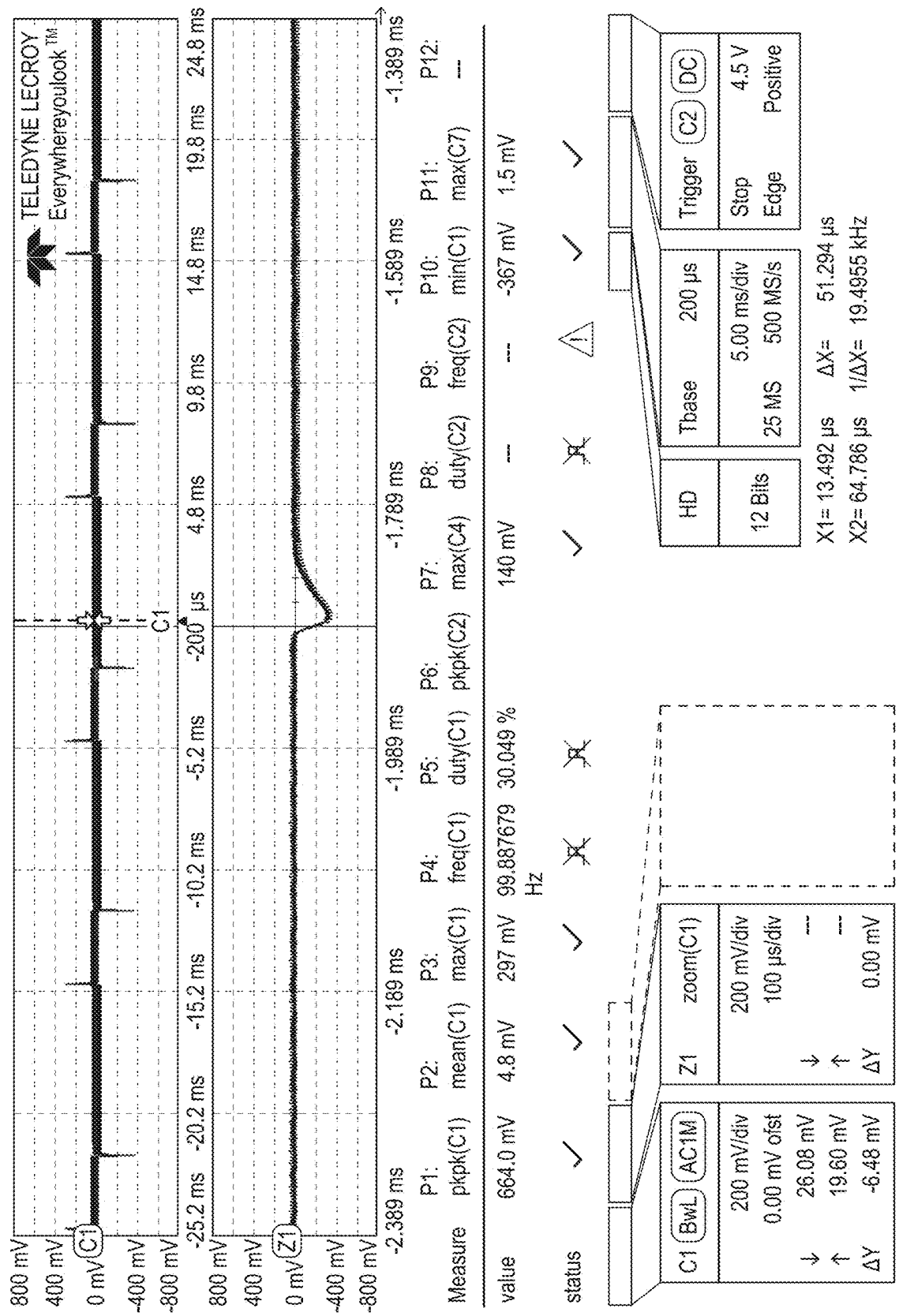
FIG. 6A is an exemplary diagram showing a measured output of the voltage source, according to an embodiments of the present disclosure.
Figure 6B:
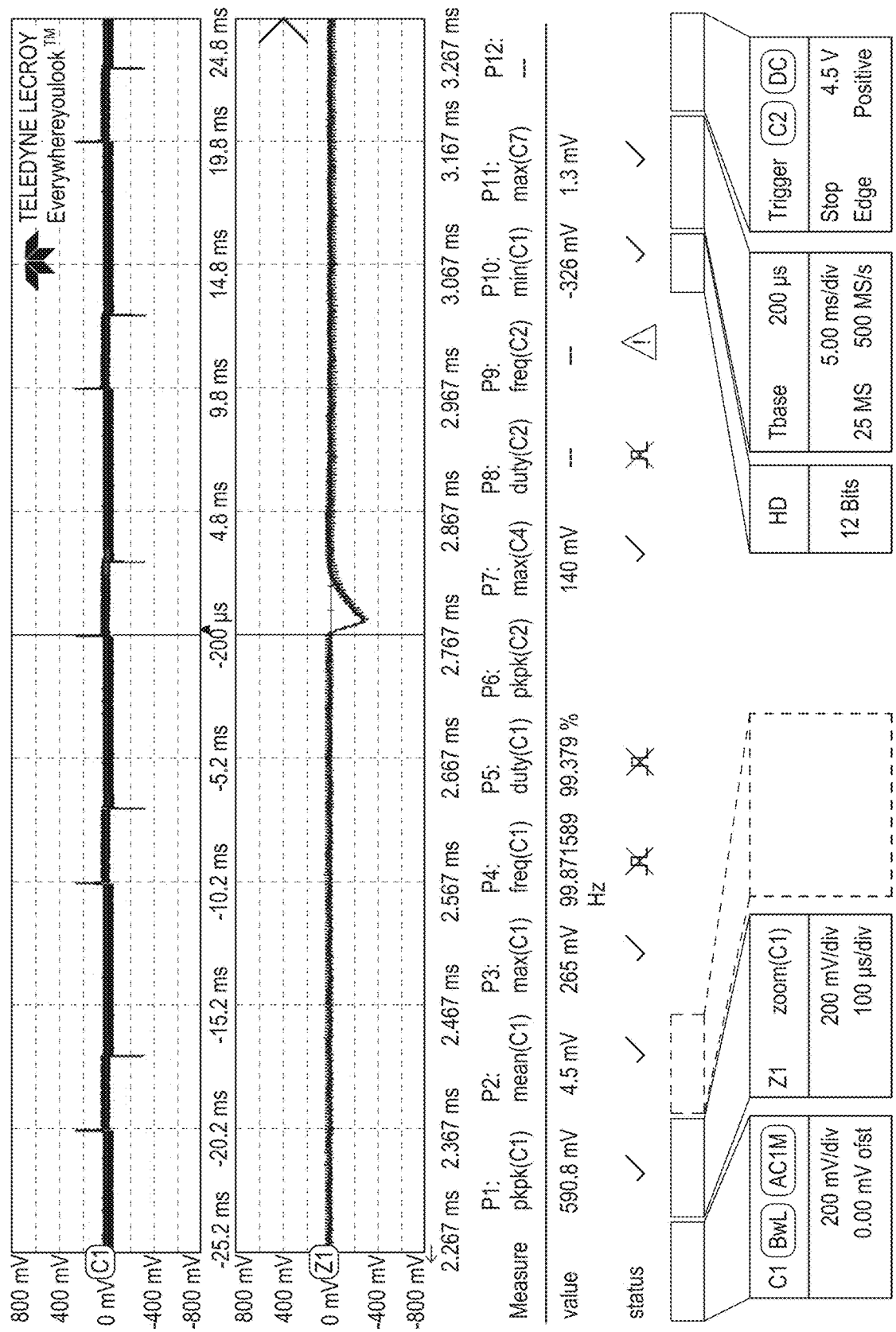
FIG. 6B is another exemplary diagram showing a measured output of the voltage source, according to an embodiments of the present disclosure.
Figure 6C:
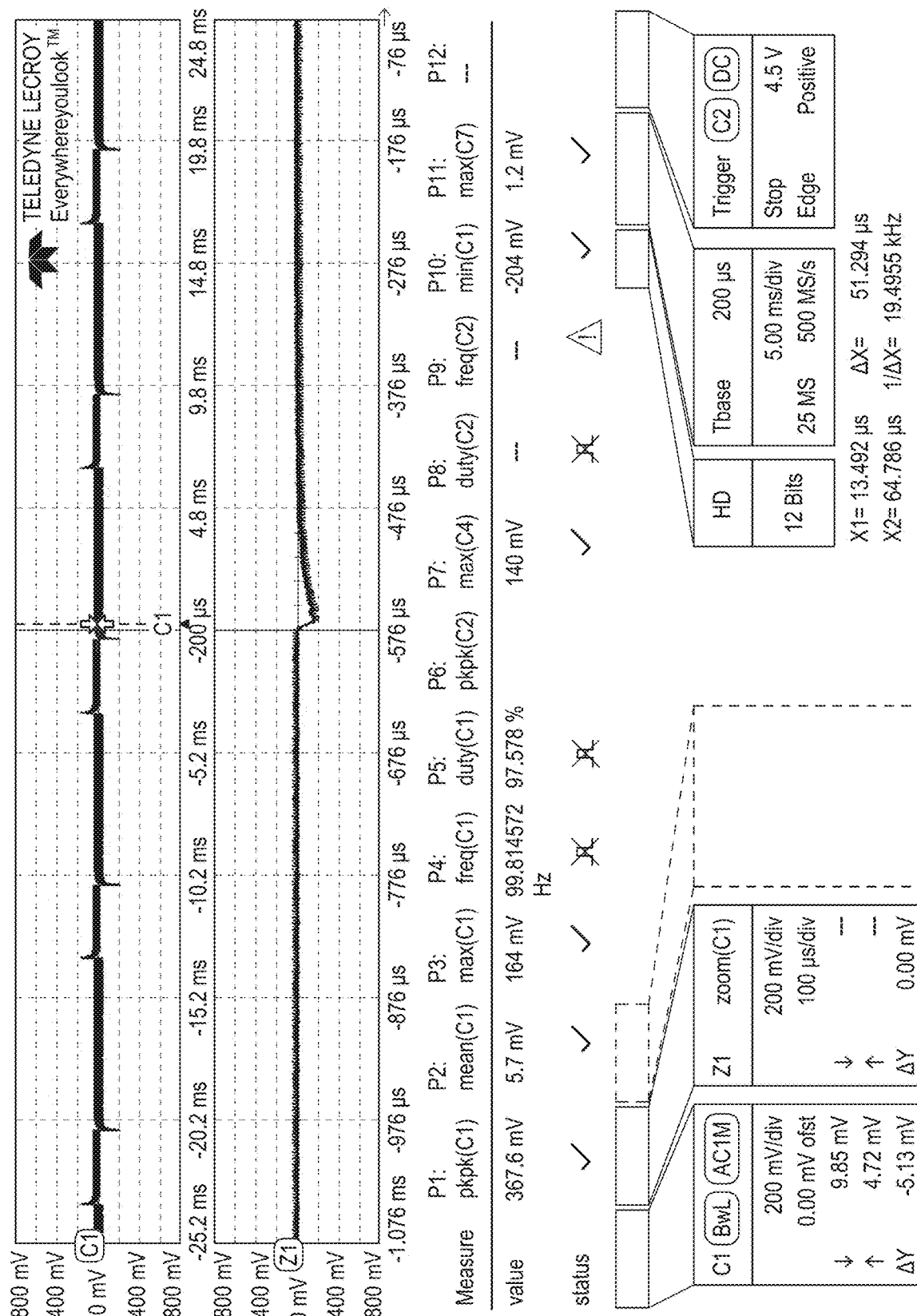
FIG. 6C is still another exemplary diagram showing a measured output of the voltage source, according to an embodiments of the present disclosure.

FIG. 6A is an exemplary diagram showing a measured output of the voltage source, according to an embodiments of the present disclosure. FIG. 6B is another exemplary diagram showing a measured output of the voltage source, according to an embodiments of the present disclosure. FIG. 6C is still another exemplary diagram showing a measured output of the voltage source, according to an embodiments of the present disclosure.

The test condition for these embodiments are 54.5 Vin, 50 Vo, 0-16 A load current, 4 A/μs load current step.

FIG. 6A is for the Loop only with the second adjustment unit 101, and is measured by the "Teledyne LeCroy" instrument. The upper plot is the overall record for the output voltage ripple, and the lower plot is the zoomed view at the probe C1.

In the FIG. 6A, Vpp (the "a" in FIG. 1B)=664 mV, Tsettle (the "b" in FIG. 1B)≈70 μs. The settling time here is measured from under/over shot return to original setpoint.

FIG. 6B is for the Loop with 101,102 and 103 (±200 mV thresholds, such as turn-on voltage of Schottky diode), and Vpp=590 mV, Tsettle≈60 μs. Vpp has 12% reduced.

FIG. 6B is for the Loop with 101, 102 and 103 (short circuit, i.e., always turned on: Vpp=368 mV, Tsettle≈100 μs, Vpp has 45% reduced.

FIG. 6A-6C shows that, when the crossover frequency and the margin are improved, the performance in the time domain is also improved greatly.

According to embodiments of the present disclosure, the compensator can dramatically boost converters' bandwidth with enough phase margin and improve output dynamic response performance. The compensator is simple, effective and low cost.

Specifically, the compensator could boost loop bandwidth higher with enough phase margin only by adding several cheap components and easily to be implemented on existing design. The output capacitance could be decreased due to the high loop bandwidth, which saves cost and space.

For example, concerning one stage power structure from −48 Vin input to power amplifier voltage with excellent performance. No bulky capacitors needed nearby PA transistors. DC&PA part space (PCB board size) and cost are saved.

In one embodiments, 16 pcs bulky capacitors may be removed and 1600 mm^2 space may be shrank.

Further, the cost of Unit 101=0.001 USD, Unit 102=0.002 USD, Unit 103=0.008 USD. Total 0.011 USD. The previous cost for bulky capacitors are 0.165 USD*16. When the produce is in enormous quantity, such as 2 M, the cost saving may be enormous, such as (0.165 USD*16-0.011 USD)*2 M=5.258 M USD will be saved.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-limiting and exemplary embodiments of this disclosure.

The invention claimed is:

1. A circuit for compensating an output of a voltage source, comprising:
   a sensing unit;
   a first adjustment unit;
   an amplifier unit; and
   a second adjustment unit, wherein
   the sensing unit is coupled between the output of the voltage source and a first input terminal of an amplifier in the amplifier unit; and the sensing unit is configured to transfer the output of the voltage source to the amplifier,
   the first adjustment unit is coupled in parallel with the sensing unit, and configured to generate one or more of: at least one pole point or at least one zero point in a transfer function of the circuit,
   a second input terminal of the amplifier in the amplifier unit is coupled to a reference voltage, and
   the second adjustment unit is coupled in parallel with a first resistor between an output of the amplifier and a controller of the voltage source, and the second adjustment unit is configured to generate at least one zero point in the transfer function of the circuit;
   wherein the circuit further comprises:
   a threshold unit, coupled with the first adjustment unit in series;
   wherein the threshold unit is configured to be turned on when a ripple of the output of the voltage source is greater than a predefined threshold and to be turned off when the ripple of the output of the voltage source is less than the predefined threshold.

2. The circuit according to claim 1, wherein the transfer function of the circuit comprises at least one of:
   a first zero point to compensate a LC resonant first pole point of a transfer function of a power stage of the voltage source;
   a second zero point lower than the LC resonant first pole point;
   a third zero point around an original gain crossover frequency of the transfer function of the circuit; wherein the original gain crossover frequency is determined when the first adjustment unit and the second adjustment unit is removed;
   a fourth zero point higher than a second pole point, which is higher than a targeted gain crossover frequency;
   a third pole point to compensate a fifth zero point related to an Equivalent Series Resistance, ESR, of a output capacitor of the power stage; or
   a fourth pole point at a switching frequency of the voltage source.

3. The circuit according to claim 1, wherein the threshold unit comprises at least one of: a diode, or a transistor.

4. The circuit according to claim 1, wherein the first adjustment unit comprises a resistor and a capacitor in series.

5. The circuit according to claim 1, wherein the second adjustment unit comprises a capacitor.

6. The circuit according to claim 1, wherein the second adjustment unit is coupled to the controller of the voltage source via an opto-coupler.

7. The circuit according to claim 1, wherein the first input terminal of the amplifier is further coupled to a ground via a second resistor.

8. The circuit according to claim 1, wherein the first input terminal is an inverting input terminal, and the second input terminal is a noninverting input terminal.

9. The circuit according to claim 1, wherein the voltage source is a DC/DC voltage source.

10. A circuit for compensating an output of a voltage source, comprising:
    a sensing unit;
    a first adjustment unit;
    an amplifier unit; and
    a second adjustment unit, wherein
    the sensing unit is coupled between the output of the voltage source and a first input terminal of an amplifier in the amplifier unit; and the sensing unit is configured to transfer the output of the voltage source to the amplifier,
    the first adjustment unit is coupled in parallel with the sensing unit, and configured to generate one or more of: at least one pole point or at least one zero point in a transfer function of the circuit,
    a second input terminal of the amplifier in the amplifier unit is coupled to a reference voltage, and
    the second adjustment unit is coupled in parallel with a resistor between an output of the amplifier and a controller of the voltage source, and the second adjustment unit is configured to generate at least one zero point in the transfer function of the circuit;
    wherein the sensing unit comprises:
    a resistor and a capacitor in series; and
    another resistor coupled in parallel with the resistor and the capacitor in series.

11. The circuit according to claim 10, wherein the transfer function of the circuit comprises at least one of:
    a zero point to compensate a LC resonant pole point of a transfer function of a power stage of the voltage source;
    a zero point lower than the LC resonant pole;
    a zero point around an original gain crossover frequency of the transfer function of the circuit; wherein the original gain crossover frequency is determined when the first adjustment unit and the second adjustment unit is removed;
    a zero point higher than a pole point, which is higher than a targeted gain crossover frequency;
    a pole point to compensate a zero point related to an Equivalent Series Resistance, ESR, of a output capacitor of the power stage; or
    a pole point at a switching frequency of the voltage source.

12. The circuit according to claim 10, wherein the first adjustment unit comprises a resistor and a capacitor in series.

13. The circuit according to claim 10, wherein the second adjustment unit comprises a capacitor.

14. The circuit according to claim 10, wherein the second adjustment unit is coupled to the controller of the voltage source via an opto-coupler.

15. The circuit according to claim 10, wherein the first input terminal of the amplifier is further coupled to a ground via a resistor.

16. The circuit according to claim 10, wherein the first input terminal is an inverting input terminal, and the second input terminal is a noninverting input terminal.

17. The circuit according to claim 10, wherein the voltage source is a DC/DC voltage source.

\* \* \* \* \*